(12) United States Patent
Schlarmann et al.

(10) Patent No.: US 9,818,656 B1
(45) Date of Patent: Nov. 14, 2017

(54) DEVICES AND METHODS FOR TESTING INTEGRATED CIRCUIT DEVICES

(71) Applicant: NXP USA, Inc., Austin, TX (US)

(72) Inventors: Mark Edward Schlarmann, Chandler, AZ (US); Dwight Lee Daniels, Phoenix, AZ (US); Stephen Ryan Hooper, Mesa, AZ (US); Chad Dawson, Queen Creek, AZ (US); Fengyuan Li, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/602,250

(22) Filed: May 23, 2017

(51) Int. Cl.
| | |
|---|---|
| *H01L 21/673* | (2006.01) |
| *H01L 21/66* | (2006.01) |
| *H01L 23/00* | (2006.01) |
| *H01L 23/495* | (2006.01) |
| *H01L 21/56* | (2006.01) |
| *H01L 21/48* | (2006.01) |
| *H01L 23/31* | (2006.01) |
| *H01L 25/065* | (2006.01) |
| *H01L 25/00* | (2006.01) |

(Continued)

(52) U.S. Cl.
CPC .......... *H01L 22/14* (2013.01); *G01R 31/2884* (2013.01); *H01L 21/4842* (2013.01); *H01L 21/561* (2013.01); *H01L 21/78* (2013.01); *H01L 23/3114* (2013.01); *H01L 23/49503* (2013.01); *H01L 23/49541* (2013.01); *H01L 23/49575* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 24/97* (2013.01); *H01L 25/0655* (2013.01); *H01L 25/50* (2013.01); *H01L 21/67309* (2013.01); *H01L 22/32* (2013.01); *H01L 2224/32245* (2013.01); *H01L 2224/48091* (2013.01); *H01L 2224/48106* (2013.01); *H01L 2224/48137* (2013.01); *H01L 2224/48247* (2013.01); *H01L 2224/73265* (2013.01); *H01L 2224/92247* (2013.01); *H01L 2924/14* (2013.01); *H01L 2924/1461* (2013.01)

(58) Field of Classification Search
CPC .......................... H01L 21/67309; H01L 22/32
USPC ........................... 438/17, 113; 257/787, 678
See application file for complete search history.

(56) References Cited

U.S. PATENT DOCUMENTS

| | | | |
|---|---|---|---|
| 5,982,042 A * | 11/1999 | Nakamura | H01L 21/78 257/203 |
| 6,365,443 B1 * | 4/2002 | Hagiwara | H01L 22/32 257/E21.662 |
| 7,030,469 B2 | 4/2006 | Mahadevan et al. | |

(Continued)

*Primary Examiner* — George Fourson, III (57) ABSTRACT

A method of testing includes attaching a first and second die to first and second die sites of a lead frame and forming a plurality of wire bonds coupling a plurality of pins of the first die site to the first die and a plurality of pins of the second die site to the second die. The first and second die are encapsulated. An isolation cut is performed to isolate the plurality of pins of the first die site from the plurality of pins of the second die site, while maintaining electrical connection between the first tie bar of the first die site and the first tie bar of the second die site. The first and second die are tested while providing a first power supply source to the first and second die via the first tie bars. After testing, the dies sites are fully singulated to result in packaged IC device.

20 Claims, 8 Drawing Sheets

(51) Int. Cl.
   *H01L 21/78*    (2006.01)
   *G01R 31/28*    (2006.01)

(56) References Cited

U.S. PATENT DOCUMENTS

| | | |
|---|---|---|
| 8,836,091 B1 | 9/2014 | Yow et al. |
| 9,285,422 B2 | 3/2016 | Dawson et al. |
| 2005/0151248 A1* | 7/2005 | Shau .................. G01R 31/2856 257/734 |
| 2007/0296090 A1* | 12/2007 | Hembree ........... G01R 1/07314 257/784 |
| 2012/0066899 A1 | 3/2012 | Sirinorakul et al. |
| 2012/0242402 A1* | 9/2012 | Seta ........................ H01L 22/32 327/538 |
| 2013/0001761 A1* | 1/2013 | Rogren ................... H01L 24/97 257/676 |
| 2013/0037927 A1* | 2/2013 | Rogren ............. H01L 23/49541 257/676 |
| 2014/0299911 A1* | 10/2014 | Zitzlsperger ............ H01L 22/32 257/99 |

* cited by examiner

DEVICES AND METHODS FOR TESTING INTEGRATED CIRCUIT DEVICES

BACKGROUND

Field

This disclosure relates generally to testing integrated circuit devices, and more specifically, to increasing parallelism during test and trim of integrated circuit devices.

Related Art

To achieve tighter specifications than manufacturing variation will allow, integrated circuit devices such as microelectromechanical sensors (MEMS) are often trimmed. This usually involves individually measuring the response of each device and adjusting digital trim-codes stored in the device's non-volatile memory (NVM) to achieve the required specifications.

For sensors, specialized test equipment is required to stimulate the device, e.g. pressure sensors require a chamber in which the pressure can be adjusted, accelerometers require flipping or shaking, etc. Dedicated equipment imposes a fixed cost and manufacturing capacity limitations. On a per-unit basis, significant expense is incurred, especially if the equipment is not fully utilized.

One way to reduce cost is increase parallelism of test, i.e. make a tester that simultaneously tests increasingly more units. The per-unit cost is reduced because the fixed costs of the test operator, manufacturing floor space, etc. is spread over a larger number of units.

The usual approach is to add additional test heads to an industry standard integrated (IC) tester. The test head is specially designed to stimulate the part, e.g. shake, pressurize, etc. Testers with up to 16 heads are under development. Specialized handlers are also required to temperature-condition and automatically feed parts in and out of the test heads. Such testers handle singulated units, i.e. every production unit is individually inserted and contacted by at least one of the test heads. The cost of developing such a complex multi-head tester and associated handler is high. The throughput of such a tester is usually limited by how fast the mechanical stimuli can be applied, e.g. it takes a significant amount of time for the pressure to stabilize after the pressure is ramped. Much effort is expended to improving the speed but there are limits. The challenge grows even greater as more test-heads are added.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Devices and methods for configuring and testing integrated circuit devices disclosed here greatly increase test parallelism and diminish the cost of testing integrated circuit devices. At the same time, the complexity of the test hardware is greatly simplified. In selected embodiments, measurements needed to trim the sensors are collected while the devices are still in strip form, i.e. before the devices are fully singulated from the strip they are manufactured on. Thus, the tester/handler would handle and contact strips containing hundreds or thousands of units rather than individual production devices. A special wiring configuration within a strip will make it possible to simultaneously power all or a subset of the devices on the strip. The required calibration data is collected and stored within the DUTs (Device/Devices Under Test) themselves. Thus, bi-directional communication is not required. Commands can be simultaneously broadcast to all the DUTs via 2-wire communication over the power line. During the data collection, there is no need for the tester to individually contact the devices within the strip and an expensive tester is not necessary while the trim data is collected. The per-unit cost of the trim is greatly reduced because the parallelism is so high.

Figure 1:
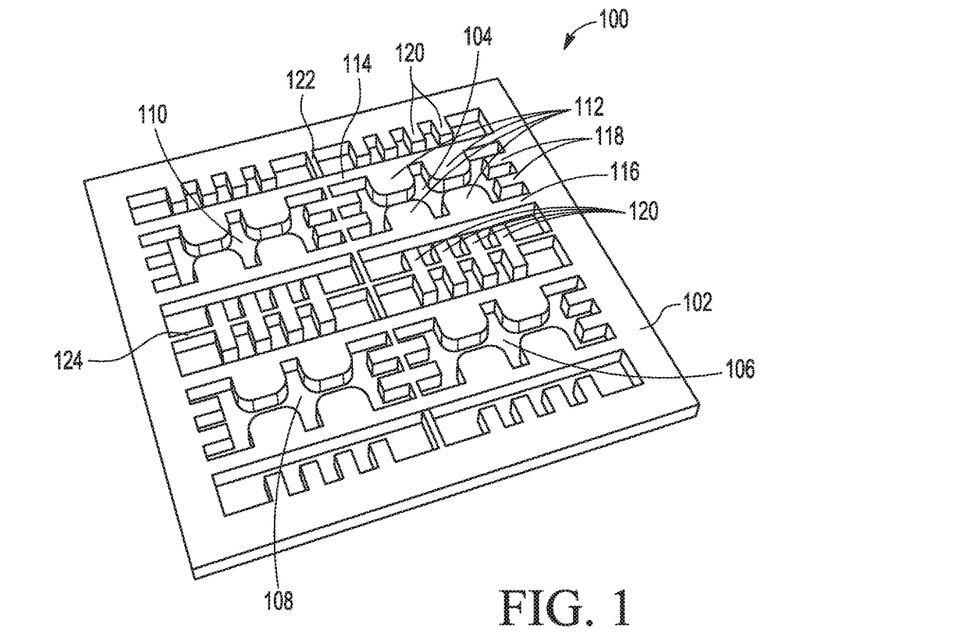
FIG. 1 is a top perspective view of an embodiment of a strip of lead frames in accordance with the present invention.

FIG. 1 is a top perspective view of an embodiment of lead frame strip 100 in accordance with the present invention that includes continuous border 102 around all four sides of the periphery of lead frame strip 100. In the example shown, the lead frames are quad flat no-lead (QFN) lead frames that includes four die sites 104, 106, 108, 110 for mounting integrated circuit (IC) devices such as packaged semiconductor die, however other embodiments of lead frame strip 100 can include additional sites for mounting IC devices. In addition, lead frame strip 100 can include other features that are not shown such as locking devices, which secure lead frame strip 100 to mold compound.

Each die site 104-110 is separated from the others by horizontal tie bar 122 and vertical tie bar 124, which intersect one another in the middle of lead frame strip 100 and are attached to border 102 at each end. Die sites 104 and 110 include additional tie bars 114, 116 are positioned between tie bar 124 and the horizontal portion of border 102 and are parallel to one another and to horizontal tie bar 124 and a horizontal portion of border 102. Die sites 106 and 108 also include tie bars similar in structure to tie bars 114, 116. As shown, each die site 104-110 includes four tabs 112 on which an IC device can be mounted or attached. Two of tabs 112 are formed with one side attached to tie bar 114, and the remaining two tabs 112 are formed with one side attached to tie bar 116. The other three sides of tabs 112 are not attached to any other structure on lead frame strip 100.

For each die site 104-110, pins 118 are shaped as rectangles spaced around tabs 112 and having one short side attached or formed integrally with an interior edge of border 102 and tie bars 122, 124. Spacing between pins 118 is sufficient to allow pins 118 to be electrically isolated from one another once lead frame strip 100 is singulated. In the example shown, each die site 104-110 includes four pins 118 on an adjacent side of tie bar 124, two pins on an adjacent side of tie bar 122, four pins 118 on a horizontal interior edge of border 102, and two pins on a vertical interior edge of border 102. The ends of tie bars 114, 116 also act as pins. Any suitable number and configuration of tabs 112, tie bars 114, 116, and pins 118 can be included in lead frame strip 100.

It is noted that the orientation of lead frame strip 100 may vary so the terms "horizontal" and "vertical" are used herein to denote an orthogonal relationship between elements. For example, if lead frame strip 100 is rotated 90 or 270 degrees, tie bar 124 and tie bars 114, 116, 124 will be vertical and tie bar 122 will be horizontal. In addition, when components of lead frame strip 100 are described as being attached or connected to lead frame strip 100, although a mechanical coupling is possible, the terms "attached" and "connected" are also used to describe embodiments where components are formed integrally with the structure of lead frame strip 100, such as by stamping, punching, etching, cutting, molding, or using another suitable technique to form lead frame strip 100.

Figure 2:
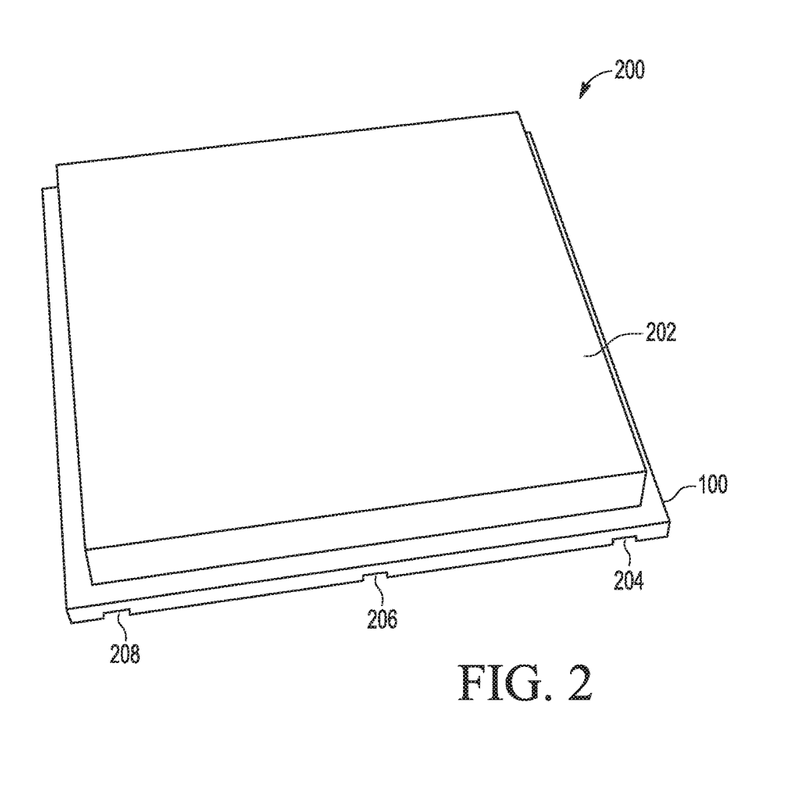
FIG. 2 is a top perspective view of an embodiment of an assembly the strip of lead frames of FIG. 1 covered with encapsulating material after step-cut in accordance with the present invention.

Referring to FIGS. 1 and 2, FIG. 2 is a top perspective view of an embodiment of an unsingulated IC device assembly 200 on lead frame strip 100 of FIG. 1 overmolded with mold compound or encapsulant 202 in accordance with the present invention. Beneath encapsulant 202, semiconductor die (not shown) containing integrated circuitry for processing, memory, and/or sensor devices are mounted or attached to tabs 112 and wire bonds (not shown) are formed between the semiconductor die and pins 118, between one of more of pins 118 and border 102, and between adjacent sections of border 102, as further described herein. Encapsulant 202 may be formed of any material suitable for protecting the semiconductor die and wire bonds on lead frame strip 100 from corrosive or harmful environmental conditions. Examples of suitable encapsulant 202 include epoxy, ceramic, silicone, and polyurethane compounds, among others. Additives such as fillers, catalysts, mold release material, pigment, flame retardants, adhesion promoters, ion traps, and stress relievers may be added to encapsulant 202, as needed. Encapsulant 202 can be formed by injection molding, compression molding, or other suitable technique.

Figure 3:
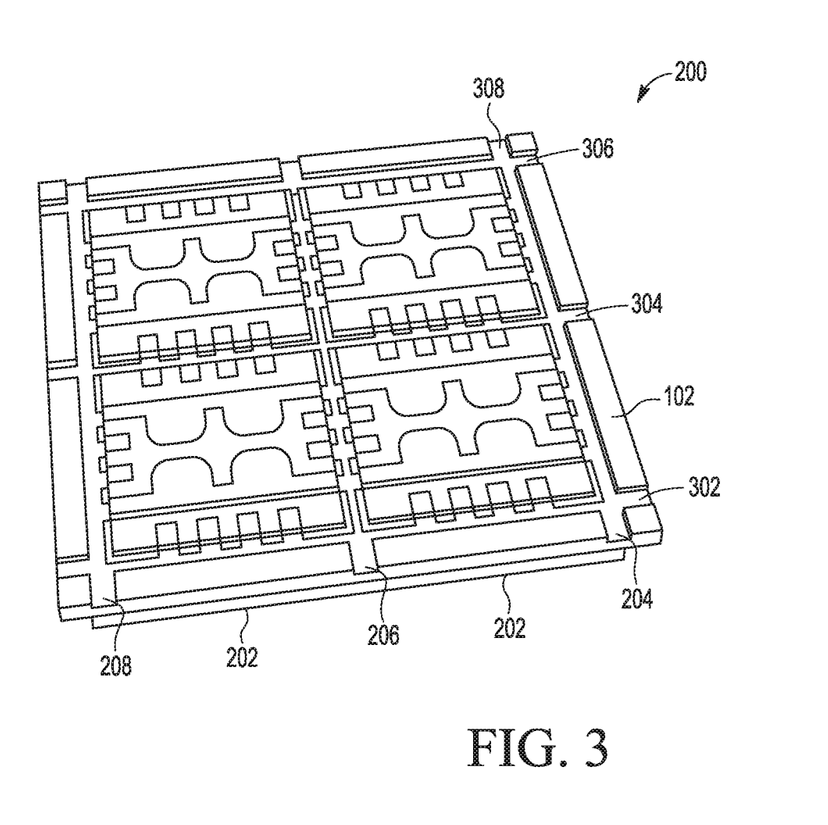
FIG. 3 is a bottom perspective view of an embodiment of the assembly of FIG. 2.

In addition to encapsulant 202 being formed on the top side of lead frame strip 100, step-cuts, or channels 204, 206, 208 are formed in a bottom side of lead frame strip 100. Additional channels or step-cuts 302, 304, 306 are shown in FIG. 3, which is a bottom perspective view of an embodiment of unsingulated assembly 200 of FIG. 2 on lead frame strip 100 of FIG. 1. As shown, step-cuts 204, 206, and 208 are parallel to one another, and step-cuts 302, 304, 306 are parallel to one another and perpendicular to step-cuts 204, 206, 208. The term "step-cut" refers to the cuts on the bottom of assembly 200 that partially cut through lead frame strip 100 and encapsulant 202. Step-cuts 204, 206, 208, 302, 304, 306 create a small ledge, for example ledge 308, around die sites 104-110. When assembly 200 is singulated and a singulated device is soldered to another surface such as a printed circuit board, step-cut ledge 308 can facilitate formation of a solder fillet that extends beyond the boundary of the part allowing for optical inspection of the solder joints.

Step-cuts 204, 208 are formed in the bottom of assembly 200 to remove respective vertical portions of border 102, pins 118, and encapsulant 202 between pins 118 along the entire width of assembly 200. Step-cuts 302, 306 are formed to remove respective horizontal portions of border 102, pins 118, and encapsulant 202 between pins 118 along the entire length of assembly 200. Step-cut 206 is formed to remove a portion of tie bar 122, pins 118, and encapsulant 202 between pins 118. Step-cut 304 is formed to remove a portion of tie bar 124, pins 118, and encapsulant 202 between pins 118.

Figure 4:
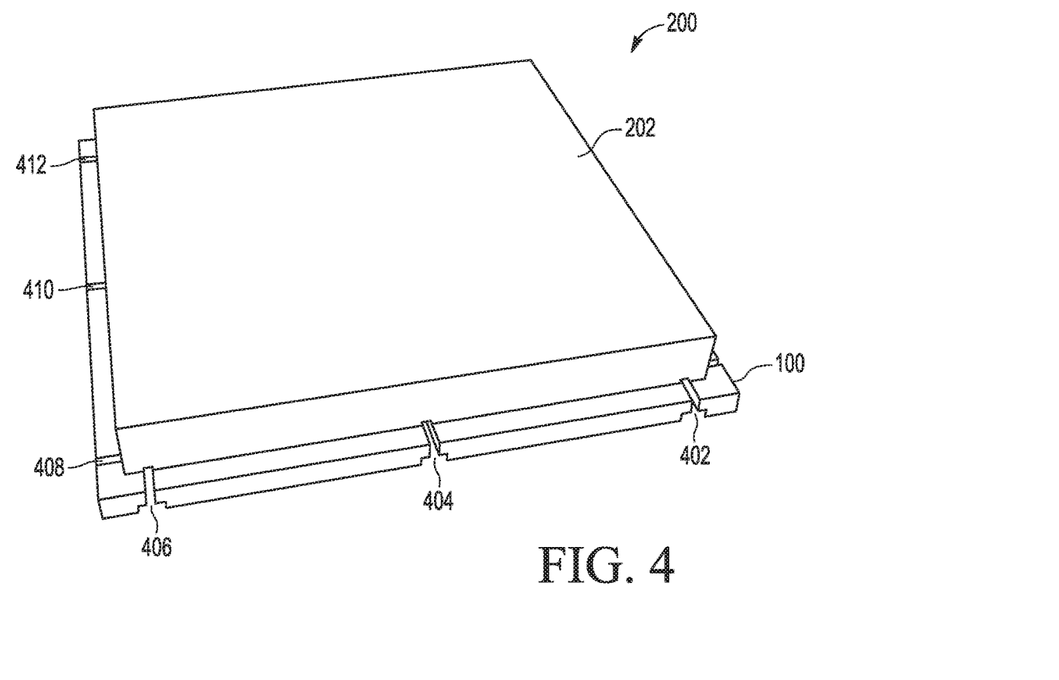
FIG. 4 is a top perspective view of the assembly of FIGS. 2 and 3 with isolation cuts in accordance with the present invention.

Referring to FIGS. 2, 3, and 4, FIG. 4 is a top perspective view of assembly 200 of FIGS. 2 and 3 with isolation cuts 402, 404, 406, 408, 410, 412 in accordance with the present invention. Isolation cuts 402, 404, 406, 408, 410, 412 are formed in a respective one of step-cuts 204, 206, 208, 302, 304, 306 but are not as wide as step-cuts 204, 206, 208, 302, 304, 306. Isolation cuts 402, 404, 406, 408, 410, 412 are formed all the way through the thickness of lead frame strip 100 so that pins 118 and tie bars 114, 116 are separated from border 102 and tie bars 122, 124. Tabs 112 remain attached to tie bars 114, 116 but tie bars 114, 116 for each die site 104-110 are separated and electrically isolated from one another with cuts 404 and 410 except for bond wires 512, 516, 518 shown in FIG. 5 that are not yet cut.

Figure 5:
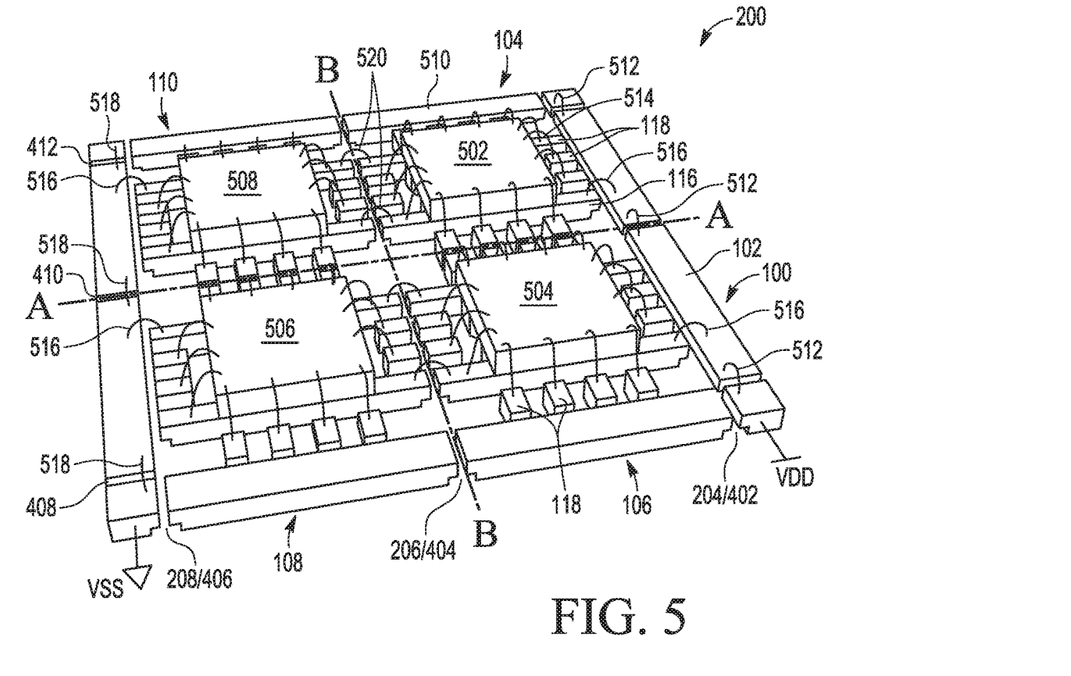
FIG. 5 is a top perspective view of the assembly of FIG. 2 without encapsulation around integrated circuit devices showing the isolation cuts of FIG. 4 in accordance with the present invention.

FIG. 5 is a top perspective view of assembly 200 of FIG. 2 without encapsulant 202 around IC devices 502-508 and wire bonds 512, 514, 516, 518 to show a more detailed view of isolation cuts 402, 404, 406, 408, 410, 412 of FIG. 4 in accordance with the present invention. Notice that isolation cuts 402, 404, 406, 408, 410, 412 isolate IC devices 502-508 from one another except where extra lead frame bond wires 512, 516 and tie-bar bond wires 518 are formed. In the example shown, bond wires 512 are formed along segments of one side of border 102 forming a rail on which power source signal or supply voltage VDD can be applied. Bond wires 518 are formed along segments of an opposite side of border 102 forming a rail to which power source signal or supply voltage VSS can be coupled. The VDD and VSS rails are electrically isolated from one another by isolation cuts 402 and 406. Bond wires 520 are also placed between tie bars 114 of die sites 104 and 110, and between die sites 106 and 108, as well as between tie bars 116 of die sites 104 and 110, and between die sites 106 and 108. Bond wires 516 are formed between VDD and VSS supply rails and tie bars 114, 116. In addition, bond wires 514 are formed between each of IC devices 502-508 and pins 118 or tie bars 114, 116. Although only one IC devices 502-508 is shown per each die site 104-110, additional die can be stacked with and/or placed alongside IC devices 502-508 to provide additional processing, memory storage, and/or sensor capabilities.

Bond wires 512, 516, 518, 520 facilitate the routing of power and ground to every die site 104-110. Thus, by applying power to the VDD and VSS rails, every IC device 502-508 can be powered simultaneously. In other embodiments, several smaller sub-domains may be formed with a different arrangement of isolation cuts, and activated at the same time by separate power supplies at different supply voltage levels.

The partially singulated assembly 200 of FIG. 5 can be used to test the functionally of IC devices 502-508 and/or to collect the sensor measurements required to trim sensors. In contrast to the existing approach of handling singulated packaged IC devices individually, in the new approach, an entire assembly 200 containing hundreds or thousands of packaged IC devices as part of assembly 200 can be handled simultaneously.

As an example of a test flow for a System On Chip (SOC) device with processor, sensor, and non-volatile memory (NVM) circuitry structures, consider a partially singulated assembly 200 oriented in a +1 g gravitational field. Power is applied to assembly 200 by contacting supply rails VDD and VSS on respective sides of border 102. IC devices 502-508 wake up, measure z-axis acceleration, and store the result in the NVM. The tester removes power from assembly 200. Next, assembly 200 is flipped to realize a −1 g acceleration. Power is applied a second time. IC devices 502-508 wake up again, take a z-axis acceleration measurement, and store the result in NVM. Assembly 200 is powered down again. This process continues until all the required sensor measurements are obtained and stored in NVM. After all measurements are taken and stored in the NVM, assembly 200 is fully singulated. At final test, the trim measurement data is read from the NVM, the correct trim coefficients are calculated and written to an appropriate trim register in the NVM. Such a process simplifies test flow, given the fact that IC devices 502-508 cycle through a specific sequence of states advancing one state each time the device is powered up. For example, the flow might be to measure +1 g acceleration at 25 degrees C., then −1 g acceleration at 25 degrees C., then 100 kPascals pressure at 25 degrees C., 900 kPascals at 25 degrees C., etc. Such an approach does not require any communication, other than the application of power, from the tester to IC devices 502-508 under test or from devices 502-508 to the tester. Only a power supply and the equipment that produces the stimuli for the sensors and/or other component(s) being tested are required while collecting the test measurement data.

Figure 6:
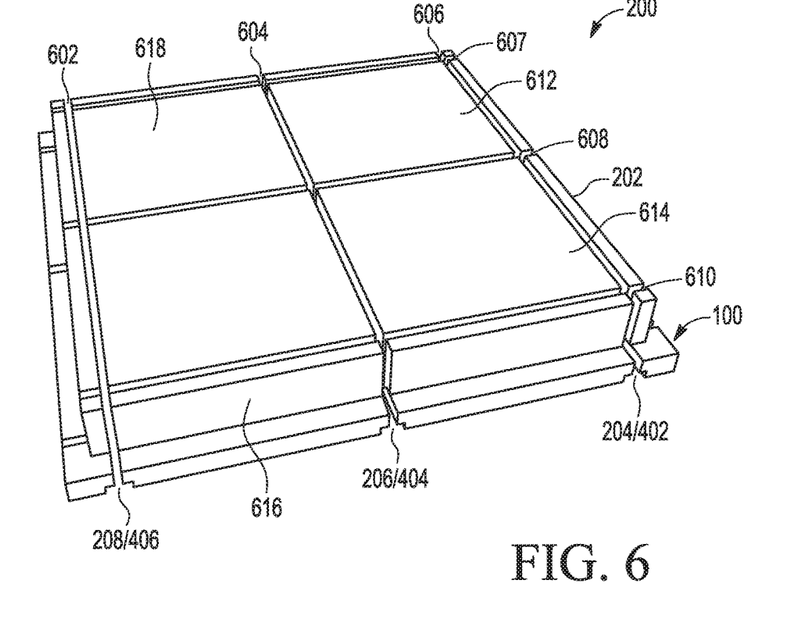
FIG. 6 is a top perspective view of the assembly of FIG. 2 with isolation cuts in the lead frame and the encapsulant in accordance with the present invention.

In other embodiments, two-wire communication between assembly 200 and a tester can be included for increased flexibility. With the addition of two-wire communication, instead of directly proceeding to the next state when assembly 200 is powered up in a defined test flow, IC devices 502-508 loop continuously while polling the supply voltage VDD waiting for a specific synchronization pattern. After the synchronization pattern is observed, IC devices 502-508 can decode a command that follows the sync pulse. IC devices 502-508 then execute a firmware function or built-in self-test (GIST) routine that is associated with the decoded command. Using this methodology, the test flow is more flexible. If a malfunction occurs at one trim measurement step, the step can be repeated. The cost of the added flexibility is that the power supply that powers the strip will need to generate the required signaling waveform. For example, a waveform generator controlling a power supply or a controlled power supply could be used. If IC devices 502-508 under test do not include a processor, additional circuitry may also be required to observe the synchronization pattern and decode the test command. Note that other signals can be communicated to IC devices 502-508 in addition to, or instead of, supply voltages VSS and VDD FIG. 6 is a top perspective view of assembly 200 of FIG. 2 with singulation cuts 602, 604, 606, 607, 608, 610 in lead frame strip 100 and encapsulant 202 in accordance with the present invention. Note that singulation cuts 602, 604, 606, 607, 608, 610 are in the same location and approximately the same width as isolation cuts 402, 404, 406, 408, 410, 412, but extend through the remaining lead frame strip 100 and encapsulant 202 including bond wires 512, 516, 518 that were added to facilitate powering up all IC devices 502-508 in assembly 200. After singulation, packaged devices 612, 614, 616, 618 have the data required for sensor trim stored in non-volatile memory and are ready to proceed to final test.

Figure 7:
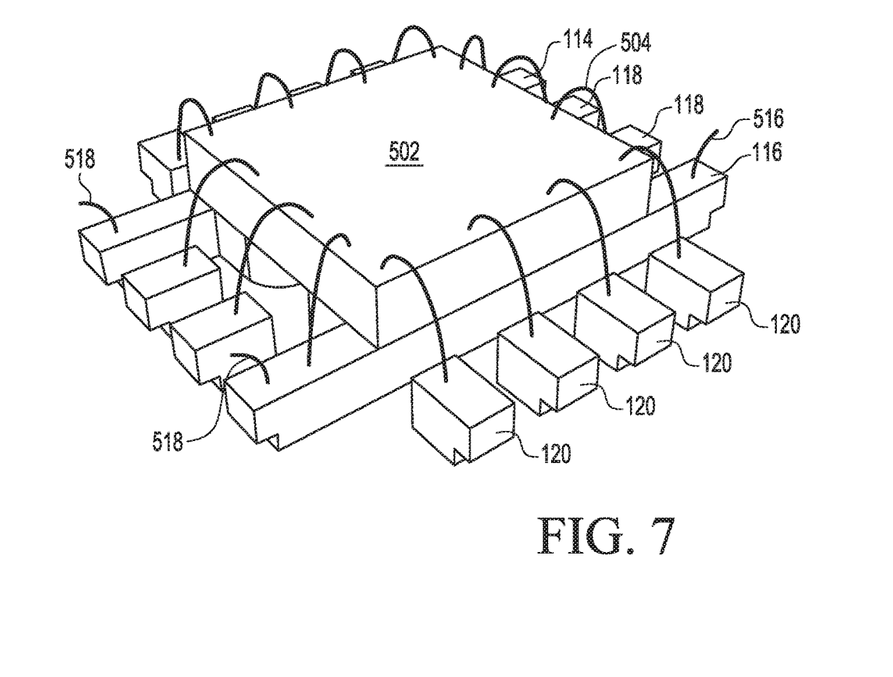
FIG. 7 is a perspective view of a single lead frame in the strip of lead frames of FIG. 1 without encapsulation around the integrated circuit die after isolation cuts have been made in accordance with the present invention.
Figure 8:
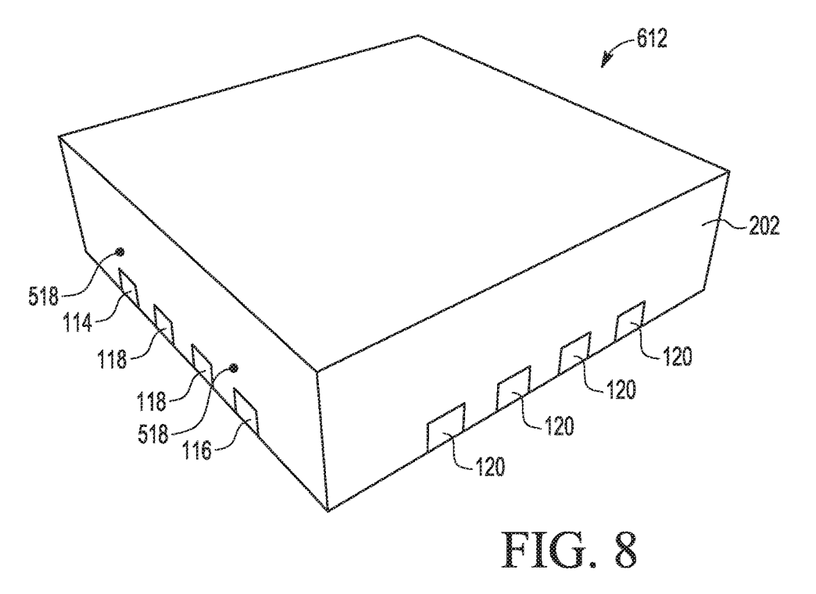
FIG. 8 is a perspective view of an embodiment of a singulated and encapsulated integrated circuit device.

Referring to FIGS. 7 and 8, FIG. 7 is a perspective view of a single lead frame in lead frame strip 100 of FIG. 1 without encapsulant 202 around IC device 502, die site 104, or bond wires 512, 516, 518 after singulation cuts 602, 604, 606, 607, 608, 610 have been made in accordance with the present invention. FIG. 8 is a perspective view of singulated IC device 612 with encapsulant 202 on IC device 502, die site 104, and bond wires 504, 516, 518. Bond wires 516, 518 used to connect die sites 104-110 to one another and to power supply rails VSS, VDD are cut during singulation but may be visible on the side of packaged device 612. Pins 120, 118 and the ends of tie bars 114, 116 are exposed through encapsulant 202 ready to be placed in contact with another component or a substrate such as a printed circuit board. It is not anticipated that bond wires 516, 518 being exposed at the edges of encapsulant 202 will present significant risk because bond wires 516, 518 are connected to tie bars 114, 116 that are already exposed to the environment.

Figure 9:
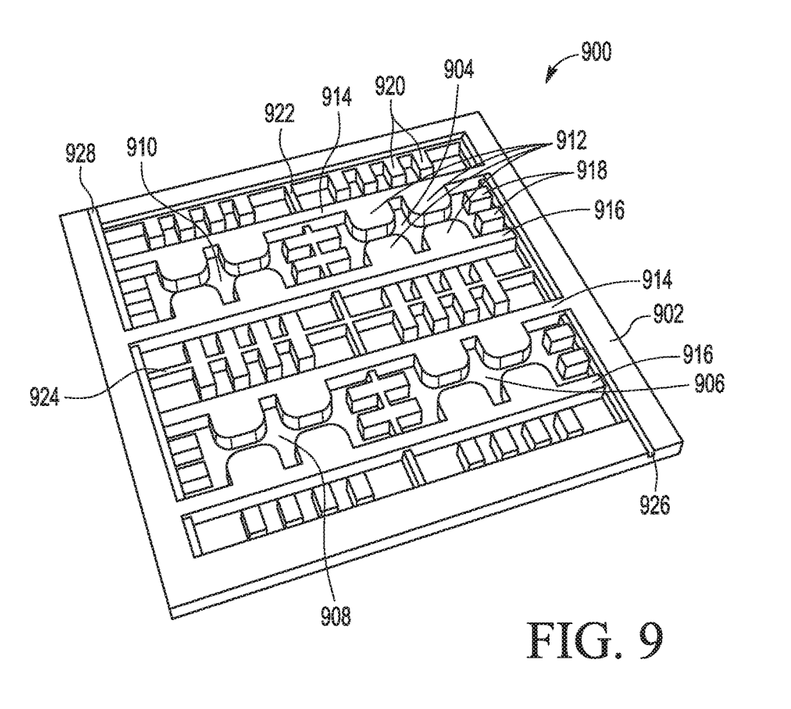
FIG. 9 is a top perspective view of another embodiment of a lead frame strip in accordance with the present invention.

FIG. 9 is a top perspective view of an embodiment of lead frame strip 900 in accordance with the present invention that includes continuous border 902 around all four sides of the periphery of lead frame strip 900. In the example shown, the lead frames are quad flat no-lead (QFN) lead frames that includes four die sites 904, 906, 908, 910 for mounting integrated circuit (IC) devices such as packaged semiconductor die, however other embodiments of lead frame strip 900 can include additional sites for mounting IC devices. In addition, lead frame strip 900 can include other features that are not shown such as locking devices, which secure lead frame strip 900 to mold compound (also referred to as encapsulant). Compared to lead frame strip 100 (FIG. 1), lead frame strip 900 differs in that it has features of varying thicknesses.

Each die site 904-910 is separated from the others by horizontal tie bar 922 and vertical tie bar 924, which intersect one another in the middle of lead frame strip 900 and are attached to border 902 at each end. Die sites 904 and 910 include additional tie bars 914, 916 are positioned between tie bar 924 and the horizontal portion of border 902 and are parallel to one another and to horizontal tie bar 924 and a horizontal portion of border 902. Die sites 906 and 908 also include tie bars similar in structure to tie bars 914, 916. As shown, each die site 904-910 includes four tabs 912 on which an IC device can be mounted or attached. Two of tabs 912 are formed with one side attached to tie bar 914, and the remaining two tabs 912 are formed with one side attached to tie bar 916. The other three sides of tabs 912 are not attached to any other structure on lead frame strip 900.

For each die site 904-910, pins 918 are shaped as rectangles spaced around tabs 912 and having one short side attached or formed integrally with an interior edge of border 902 and tie bars 922, 924. Spacing between pins 918 is sufficient to allow pins 918 to be electrically isolated from one another once lead frame strip 900 is singulated. In the example shown, each die site 904-910 includes four pins 920 on an adjacent side of tie bar 924, two pins on an adjacent side of tie bar 922, four pins 918 on a horizontal interior edge of border 902, and two pins on a vertical interior edge of border 902. The ends of tie bars 914, 916 are also used as pins. Any suitable number and configuration of tabs 912, tie bars 914, 916, and pins 918 can be included in lead frame strip 900, however.

Border 902 includes notches 926, 928 on one side of two opposing inner edges to which pins 918, and tie bars 914, 916, 922 and 924 are attached. Notch 926 starts at an edge of border 902 and extends to tie bar 914 in die site 906. Notch 926 continues on the other side of tie bar 914 in die site 906 up to tie bar 914 in die site 904. Notch 926 continues on the other side of tie bar 914 in die site 904 around the inner edge of border 902 past die sites 904 and 910 and up to notch 928 in the opposing side of border 902.

Notch 928 starts at an edge of border 902 and extends to tie bar 916 in die site 910. Notch 928 continues on the other side of tie bar 916 in die site 910 down to tie bar 916 in die site 908. Notch 928 continues on the other side of tie bar 916 in die site 908 around the inner edge of border 902 past die sites 908 and 96 and up to notch 926 in the opposing side of border 902.

The thickness of tie bars 922 and 924 is the same as the thickness of border 902 where notches 926 and 928 are located. The thickness of the remaining components in lead frame strip 900 including tabs 912, tie bars 914, 916, and pins 918, 920 is greater than the thickness of border 902 where notches 926 and 928 are located and tie bars 922 and 924.

It is noted that the orientation of lead frame strip 900 may vary so the terms "horizontal" and "vertical" are used herein to denote an orthogonal relationship between elements. For example, if lead frame strip 900 is rotated 90 or 270 degrees, tie bar 924 and tie bars 914, 916, 922 will be vertical and tie bar 924 will be horizontal. In addition, when components of lead frame strip 900 are described as being attached or connected to lead frame strip 900, although a mechanical coupling is possible, the terms "attached" and "connected" are also used to describe embodiments where components are formed integrally with the structure of lead frame strip 900, such as by stamping, punching, etching, cutting, molding, or using another suitable technique to form lead frame strip 900.

Figure 10:
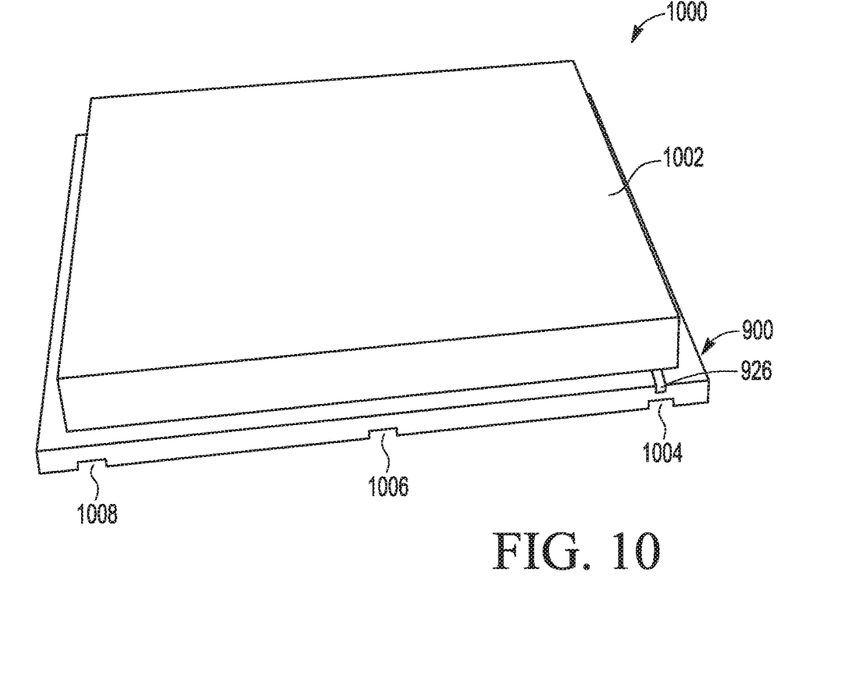
FIG. 10 is a top perspective view of an embodiment of the lead frame strip of FIG. 9 with encapsulated integrated circuits in accordance with the present invention.

Referring to FIGS. 9 and 10, FIG. 10 is a top perspective view of an embodiment of an unsingulated IC device assembly 1000 on lead frame strip 900 of FIG. 9 overmolded with mold compound or encapsulant 1002 in accordance with the present invention. Beneath encapsulant 1002, semiconductor die (not shown) containing integrated circuitry for processing, memory, and/or sensor devices are mounted or attached to tabs 912 and wire bonds (not shown) are formed between the semiconductor die and pins 918, between one of more of pins 918 and border 902, and between adjacent sections of border 902, as further described herein. Encapsulant 1002 may be formed of any material suitable for protecting the semiconductor die and wire bonds on lead frame strip 900 from corrosive or harmful environmental conditions. Examples of suitable encapsulant 1002 include epoxy, ceramic, silicone, and polyurethane compounds, among others. Additives such as fillers, catalysts, mold release material, pigment, flame retardants, adhesion promoters, ion traps, and stress relievers may be added to encapsulant 1002, as needed. Encapsulant 1002 can be formed by injection molding, compression molding, or other suitable technique.

In addition to encapsulant 1002 being formed on the top side of lead frame strip 900, step-cuts, or channels 1004, 1006, 1008 are formed in a bottom side of lead frame strip 900. As shown, step-cuts 1004, 1006, and 1008 are parallel to one another. Additional channels or step-cuts (not shown) can be included on the bottom side of lead frame strip 900, and can also be parallel to one another and perpendicular to step-cuts 1004, 1006, 1008. The term "step-cut" refers to the cuts on the bottom of assembly 1000 that partially cut through lead frame strip 900 and encapsulant 1002. Step-cuts 1004, 1006, 1008 create a small ledge around die sites 904-910. When assembly 1000 is singulated and a singulated device is soldered to another surface such as a printed circuit board, the step-cut ledge can facilitate formation of a solder fillet that extends beyond the boundary of the part allowing for optical inspection of the solder joints.

Step-cuts 1004, 1008 are formed in the bottom of assembly 1000 to remove respective vertical portions of border 902, pins 918, and encapsulant 1002 between pins 918 along the entire width of assembly 1000. Additional step-cuts (not shown) are formed to remove respective horizontal portions of border 902, pins 918, and encapsulant 1002 between pins 918 along the entire length of assembly 1000. Step-cut 1006 is formed to remove a portion of tie bar 922, pins 918, and encapsulant 1002 between pins 918. An additional step-cut (not shown) removes a portion of tie bar 924, pins 918, and encapsulant 1002 between pins 918.

Figure 11:
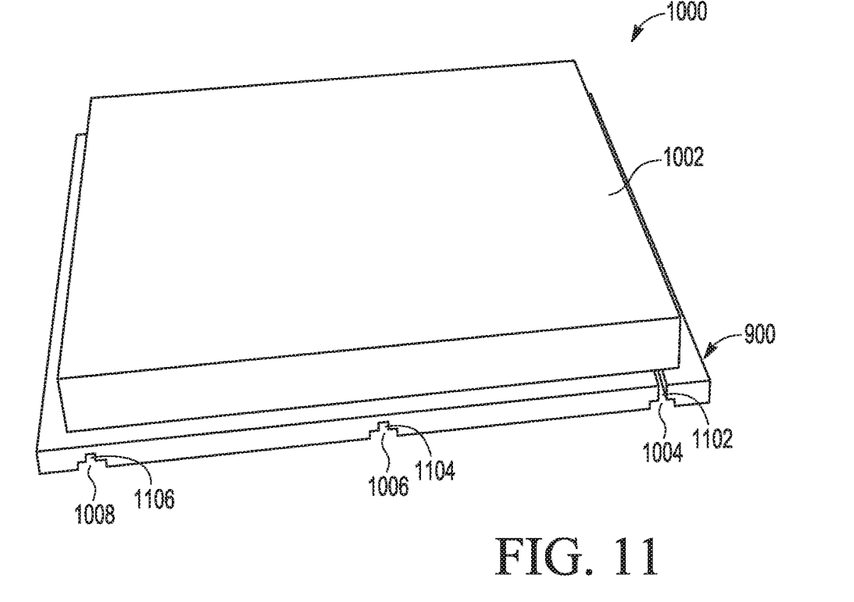
FIG. 11 is a top perspective view of the lead frame strip of FIG. 9 with isolation cuts in accordance with the present invention.
Figure 12:
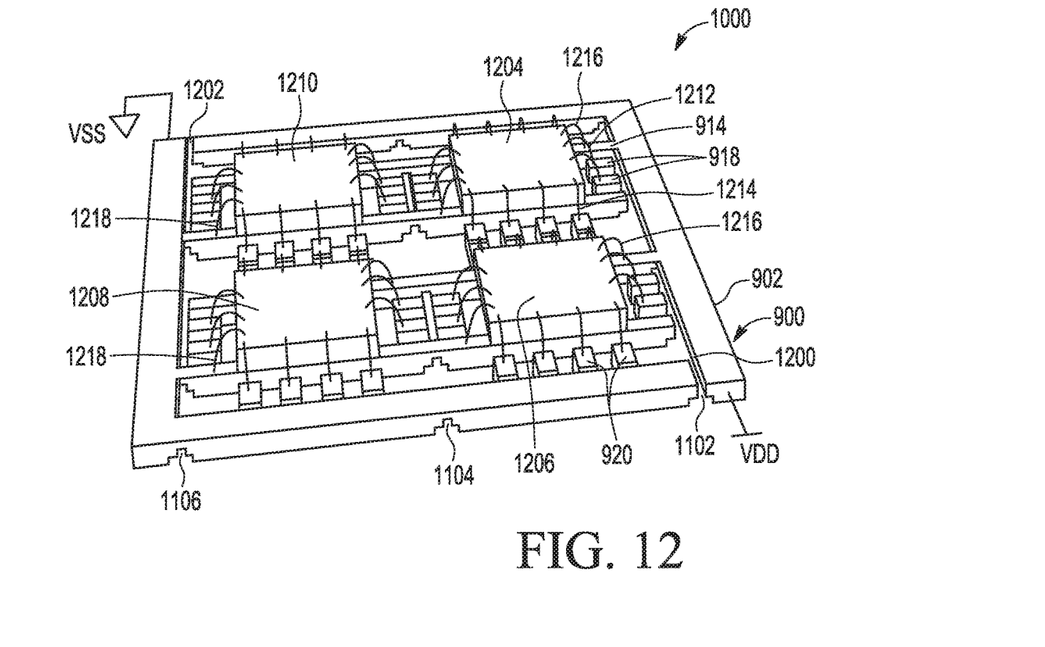
FIG. 12 is a top perspective view of the lead frame strip of FIG. 11 without encapsulation around the integrated circuit die showing the isolation cuts in the lead frame in accordance with the present invention.

Referring to FIGS. 10, 11 and 12, FIG. 11 is a top perspective view of assembly 1000 with isolation cuts 1102, 1104, 1106 in accordance with the present invention. Isolation cuts 1102, 1104, 1106 are formed in a respective one of step-cuts 1004, 1006, 1008 but are not as wide as step-cuts 1004, 1006, 1008. Isolation cuts 1102, 1104, 1106 are made along the vertical direction, and additional isolation cuts (not shown) are made in the horizontal direction. Isolation cuts 1102, 1104, 1106 are formed through the entire thickness of tie bars 922, 924, thereby removing tie bars 922, 924 and notches 926, 928. After isolation cuts 1102-1106 are made, pins 918, 920 are separated from border 902 and tie bars 922, 924. Tabs 912 remain attached to tie bars 914, 916. Tie bar 914 remain connected VDD and VSS supply rails.

Referring to FIGS. 9 and 12, FIG. 12 is a top perspective view of assembly 1000 of FIG. 10 without encapsulant 1002 around IC devices 1204-1210 and wire bonds 1212-1218 to show a more detailed view of isolation cuts 1102, 1104, 1106 of FIG. 11 in accordance with the present invention. Notice that isolation cuts 1102, 1104, 1106 isolate IC devices 1204-1210 from one another except where extra tie-bar bond wires 1216, 1218 are formed. Border 902 is separated into two sections by isolation cuts 1102 and 1106. One section of border 902 forms a rail on which supply voltage VDD can be applied. The other section of border 902 forms another rail to which supply voltage VSS can be coupled. The VDD and VSS rails are electrically isolated from one another by isolation cuts 1102 and 1106. Bond wires 1216 are formed between tie bars 914 and respective IC devices 1204-1210 to couple IC devices 1204-1210 to the VDD supply rail. Bond wires 1218 are formed between tie bars 916 and respective IC devices 1204-1210 to couple IC devices 1204-1210 to the VSS supply rail. In addition, bond wires 1212 are formed between each of IC devices 1204-1210 and pins 918. Note that tie bars 914, 916 remain connected between die sites 904 and 910, and between die sites 906 and 908 so that each die site 904-910 is connected to both the VDD and VSS supply rails by wire bonds 1216 ad 1218, respectively.

Although only one IC device 1204-1210 is shown per each die site 904-910, additional die can be stacked with or mounted alongside IC devices 1204-1210 to provide additional processing, memory storage, and/or sensor capabilities.

The tie bars 914, 916 and bond wires 1216, 1218 facilitate the routing of power and ground to every die site 904-910. Thus, by applying power to the VDD and VSS rails, every IC device 1204-1210 can be powered simultaneously. In other embodiments, several smaller sub-domains may be formed with a different arrangement of isolation cuts, and activated at the same time by separate power supplies at different supply voltage levels.

The partially singulated assembly 1000 of FIG. 12 can be used to test the functionally of IC devices 1204-1210 and/or to collect the sensor measurements required to trim sensors, as described hereinabove for FIG. 5. In contrast to the existing approach of handling singulated packaged IC devices individually, in the new approach, an entire assembly 1000 containing hundreds or thousands of packaged IC devices as part of assembly 1000 can be handled simultaneously.

Figure 13:
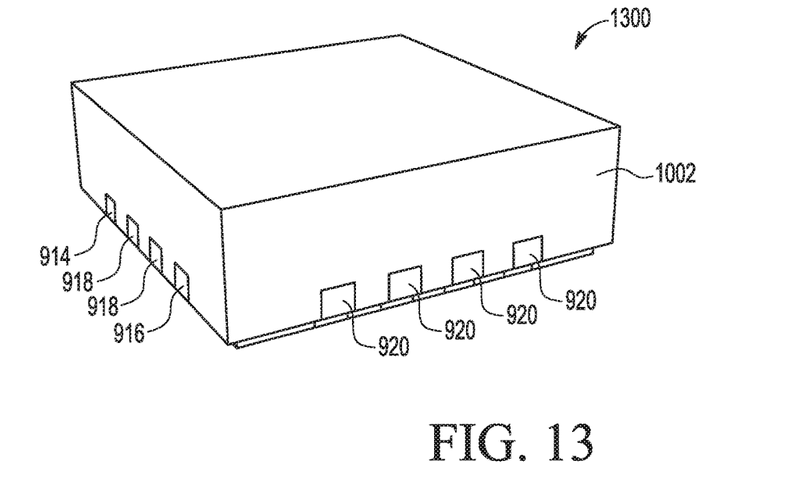
FIG. 13 is a top perspective view of an embodiment of a singulated and encapsulated integrated circuit device.
Figure 14:
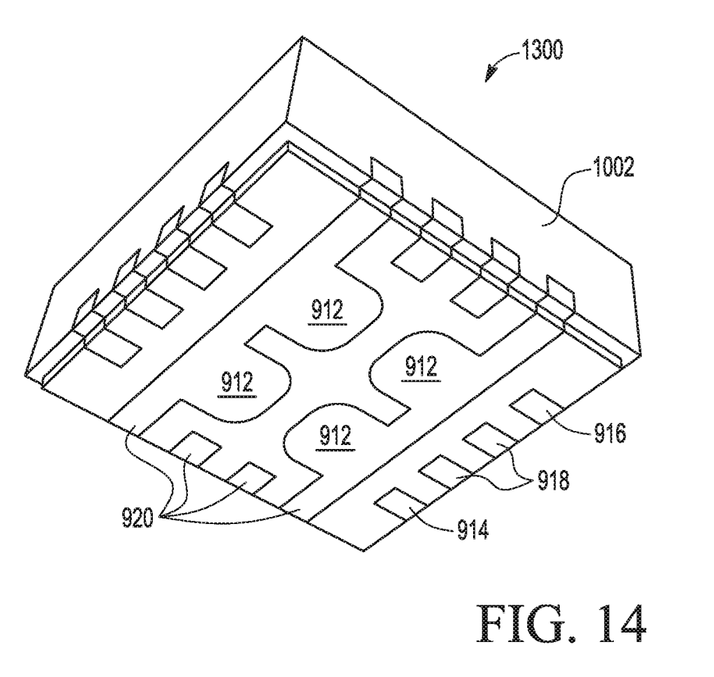
FIG. 14 is a bottom perspective view of the singulated and encapsulated integrated circuit device of FIG. 13.

Referring to FIGS. 13 and 14, FIG. 13 is a perspective view of a singulated packaged IC device 1300 in lead frame strip 900 of FIG. 9 with encapsulant 1002 around IC device 1204, die site 904, and bond wires 1212, 1216, 1218 after singulation cuts have been made in accordance with the present invention. FIG. 14 is a perspective view of the bottom of singulated IC device 1300. Note that no bond wires are exposed through encapsulant 1002.

By now it should be appreciated that in some embodiments, there has been provided a method of testing multiple die that can comprise attaching a first die (502, 1204) to a first die site (104, 904) of a lead frame strip (100, 900) and a second die (504, 1206) to a second die site (106, 906) of the lead frame strip. The first die site includes a first tab (112, 912), a first tie bar (114, 914) extending between opposite sides of the first die site and connected to the first tab of the first die site, and a plurality of pins (118, 120, 918, 920). The first die is attached to the first tab of the first die site. The second die site includes a first tab (112, 912), a first tie bar (114, 914) extending between opposite sides of the first die site and connected to the first tab of the second die site, and a plurality of pins (118, 120, 918, 920). The second die is attached to the first tab of the second die site. A plurality of wire bonds (514, 512, 1212) are formed coupling the plurality of pins of the first die site to the first die and coupling the plurality of pins of the second die site to the second die. The first and second die are encapsulated (202, 1002). An isolation cut (402-408, 1102-1108) is performed to isolate the plurality of pins of the first die site from the plurality of pins of the second die site and from the lead frame strip, while maintaining an electrical connection between the first tie bar of the first die site and the first tie bar of the second die site. After performing the isolation cut, the first and second die are tested while providing a first power supply source (VDD, VSS) to the first and second die via the first tie bars. After testing, the first and second die sites are fully isolated to result in first and second singulated packaged integrated circuit (IC) devices (612, 1300).

In another aspect, the method can further comprise, prior to the encapsulating, forming an intra die site wire bond (518) coupling the first tie bar of the first die site to the first tie bar of the second die site.

In another aspect, the isolation cut can be performed by cutting the lead frame strip between the first and second die sites to isolate the plurality of pins of the first die site from the plurality of pins of the second die site, and partially cutting into the encapsulant. The intra die site wire bond remains uncut to maintain electrical connection between the first tie bar of the first die site and the first tie bar of the second die site.

In another aspect, the method can further comprise, prior to encapsulating, forming a lead frame wire bond (512) coupling the first tie bar of the first die site to a first portion of the lead frame strip.

In another aspect, the first tie bar of each of the first and second die sites can have a thickness that is the same as a thickness of the plurality of pins of each of the first and second die sites.

In another aspect, the isolation cut can be performed by cutting the lead frame strip between the first and second die sites through the entire thickness of the plurality of pins of the first and second die sites to isolate the plurality of pins of the first die site from the plurality of pins of the second die site but not cutting through the entire thickness of the first tie bar of the first die site and the first tie bar of the second die site between the first and second die sites such that the electrical connection between the first tie bar of the first die site and the first tie bar of the second die site is maintained.

In another aspect, the isolation cut can be performed by cutting through the entire thickness of the second tie bar of the second die site to form a separation between the second tie bar and the lead frame strip.

In another aspect, the isolation cut maintains electrical connection between the first tie bar of the first die site and a first portion of the lead frame strip, wherein during testing, the first power supply source is only coupled to the first portion of the lead frame strip.

In another aspect, the first die site can further include a second tab, and a second tie bar extending between opposite sides of the die site and connected to the second tab of the first die site. The first die can also be attached to the second tab of the first die site. The second die site can further include a second tab, and a second tie bar extending between opposite sides of the die site and connected to the second tab of the second die site. The second die can also be attached to the second tab of the second die site.

In another aspect, the method can further comprise, prior to the encapsulating, forming a first intra die site wire bond coupling the first tie bar of the first die site to the first tie bar of the second die site and a second intra die site wire bond coupling the second tie bar of the first die site to the second tie bar of the second die site.

In another aspect, the isolation cut can be performed by cutting the lead frame strip between the first and second die sites to isolate the plurality of pins of the first die site from the plurality of pins of the second die site and partially cutting into the encapsulant. The first intra die site wire bond remains uncut to maintain electrical connection between the first tie bar of the first die site and the first tie bar of the second die site and the second intra die site wire bond remains uncut to maintain electrical connection between the second tie bar of the first die site and the second tie bar of the second die site.

In another aspect, the first tie bar and the second tie bar of each of the first and second die sites can have a thickness that is the same as a thickness of the plurality of pins of each of the first and second die sites.

In another aspect, the isolation cut can be performed by cutting the lead frame strip between the first and second die sites through the entire thickness of the plurality of pins of the first and second die sites to isolate the plurality of pins of the first die site from the plurality of pins of the second die site but not cutting through the entire thickness of the first tie bar and the second tie bar of each of the first and second die sites between the first and second die sites to maintain electrical connection between the first tie bar of the first die site and the first tie bar of the second die site and to maintain electrical connection between the second tie bar of the first die site and the second tie bar of the second die site.

In another aspect, the isolation cut can isolate a first portion of the lead frame strip from a second portion of the lead frame strip while maintaining electrical connection between the first tie bar of both the first and second die sites and the first portion of the lead frame strip and between the second tie bar of both the first and second die sites and the second portion of the lead frame strip. During testing, a power supply source is connected between to the first portion of the lead frame strip and the second portion of the lead frame strip.

In another aspect, a portion of the first tie bar of the first die site is at least partially routed through the first packaged IC device and a portion of the second tie bar of the first die site is at least partially routed through the second packaged IC device.

In further embodiments, a packaged semiconductor device can comprise a tab, a tie bar extending between opposite ends of the packaged semiconductor device and connected to the tab, a plurality of pins, a die attached to the tab, a plurality of wire bonds connected between the plurality of pins and the die, a mold compound surrounding the die and wire bonds, and at least partially surrounding the plurality of pins and tie bar, such that an end portion of each of the plurality of pins and end portions of the tie bar are exposed at minor sides of the packaged semiconductor device. A partial wire bond can have one end connected to the tie bar and a second end extending to a minor side of the packaged semiconductor device such that it is exposed through the mold compound.

In another aspect, the tie bar is at least partially routed through the packaged semiconductor device.

In another aspect, the partial wire bond can be exposed through the mold compound at a same minor side as an end portion of the tie bar to which the partial wire bond is connected.

In another aspect, the packaged semiconductor device can further comprise a second tab, and a second tie bar extending between opposite ends of the packaged semiconductor device and connected to the second tab. The die can also be attached to the second tab. The mold compound at least partially surrounds the second tie bar such that end portions of the second tie bar are exposed at minor sides of the packaged semiconductor device. A second partial wire bond can have one end connected to the second tie bar and a second end extending to a second minor side of the packaged semiconductor device such that the second partial wire bond is exposed through the mold compound.

In another aspect, the tie bar routes a first power source signal and the second tie bar routes a second power source signal.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of testing multiple die comprising:
   attaching a first die to a first die site of a lead frame strip and a second die to a second die site of the lead frame strip, wherein:
     the first die site includes a first tab, a first tie bar extending between opposite sides of the first die site and connected to the first tab of the first die site, and a plurality of pins, wherein the first die is attached to the first tab of the first die site;
     the second die site includes a first tab, a first tie bar extending between opposite sides of the first die site and connected to the first tab of the second die site, and a plurality of pins, wherein the second die is attached to the first tab of the second die site;
   forming a plurality of wire bonds coupling the plurality of pins of the first die site to the first die and coupling the plurality of pins of the second die site to the second die;
   encapsulating the first and second die;
   performing an isolation cut to isolate the plurality of pins of the first die site from the plurality of pins of the second die site and from the lead frame strip, while maintaining an electrical connection between the first tie bar of the first die site and the first tie bar of the second die site;
   after performing the isolation cut, testing the first and second die while providing a first power supply source to the first and second die via the first tie bars; and
   after the testing, fully isolating the first and second die sites to result in first and second singulated packaged integrated circuit (IC) devices.

2. The method of claim 1, further comprising:
   prior to the encapsulating, forming an intra die site wire bond coupling the first tie bar of the first die site to the first tie bar of the second die site.

3. The method of claim 2, wherein performing the isolation cut comprises:
   cutting the lead frame between the first and second die sites to isolate the plurality of pins of the first die site from the plurality of pins of the second die site, and partially cutting into the encapsulant wherein the intra die site wire bond remains uncut to maintain electrical connection between the first tie bar of the first die site and the first tie bar of the second die site.

4. The method of claim 3, further comprising:
prior to encapsulating, forming a lead frame wire bond coupling the first tie bar of the first die site to a first portion of the lead frame strip.

5. The method of claim 1, wherein the first tie bar of each of the first and second die sites have a thickness that is the same as a thickness of the plurality of pins of each of the first and second die sites.

6. The method of claim 5, wherein performing the isolation cut comprises:
cutting the lead frame between the first and second die sites through the entire thickness of the plurality of pins of the first and second die sites to isolate the plurality of pins of the first die site from the plurality of pins of the second die site but not cutting through the entire thickness of the first tie bar of the first die site and the first tie bar of the second die site between the first and second die sites such that the electrical connection between the first tie bar of the first die site and the first tie bar of the second die site is maintained.

7. The method of claim 6, wherein performing the isolation cut comprises:
cutting through the entire thickness of the second tie bar of the second die site to form a separation between the second tie bar and the lead frame strip.

8. The method of claim 1, wherein the performing the isolation cut maintains electrical connection between the first tie bar of the first die site and a first portion of the lead frame strip wherein during testing, the first power supply source is only coupled to the first portion of the lead frame strip.

9. The method of claim 1, wherein:
the first die site further includes a second tab, a second tie bar extending between opposite sides of the die site and connected to the second tab of the first die site, wherein the first die is also attached to the second tab of the first die site, and
the second die site further includes a second tab, a second tie bar extending between opposite sides of the die site and connected to the second tab of the second die site, wherein the second die is also attached to the second tab of the second die site.

10. The method of claim 9, further comprising:
prior to the encapsulating, forming a first intra die site wire bond coupling the first tie bar of the first die site to the first tie bar of the second die site and a second intra die site wire bond coupling the second tie bar of the first die site to the second tie bar of the second die site.

11. The method of claim 10, wherein performing the isolation cut comprises:
cutting the lead frame strip between the first and second die sites to isolate the plurality of pins of the first die site from the plurality of pins of the second die site and partially cutting into the encapsulant wherein the first intra die site wire bond remains uncut to maintain electrical connection between the first tie bar of the first die site and the first tie bar of the second die site and the second intra die site wire bond remains uncut to maintain electrical connection between the second tie bar of the first die site and the second tie bar of the second die site.

12. The method of claim 9, wherein the first tie bar and the second tie bar of each of the first and second die sites have a thickness that is the same as a thickness of the plurality of pins of each of the first and second die sites.

13. The method of claim 12, wherein performing the isolation cut comprises:
cutting the lead frame strip between the first and second die sites through the entire thickness of the plurality of pins of the first and second die sites to isolate the plurality of pins of the first die site from the plurality of pins of the second die site but not cutting through the entire thickness of the first tie bar and the second tie bar of each of the first and second die sites between the first and second die sites to maintain electrical connection between the first tie bar of the first die site and the first tie bar of the second die site and to maintain electrical connection between the second tie bar of the first die site and the second tie bar of the second die site.

14. The method of claim 7, wherein the performing the isolation cut isolates a first portion of the lead frame from a second portion of the lead frame strip while maintaining electrical connection between the first tie bar of both the first and second die sites and the first portion of the lead frame strip and between the second tie bar of both the first and second die sites and the second portion of the lead frame strip, wherein during testing, the first power supply source is coupled to the first portion of the lead frame strip and a second power supply source is coupled to the second portion of the lead frame strip.

15. The method of claim 1, wherein a portion of the first tie bar of the first die site is at least partially routed through the first packaged IC device and a portion of the second tie bar of the first die site is at least partially routed through the second packaged IC device.

16. A packaged semiconductor device, comprising:
a tab;
a tie bar extending between opposite ends of the packaged semiconductor device and connected to the tab;
a plurality of pins;
a die attached to the tab;
a plurality of wire bonds connected between the plurality of pins and the die;
a mold compound surrounding the die and wire bonds, and at least partially surrounding the plurality of pins and tie bar, such that an end portion of each of the plurality of pins and end portions of the tie bar are exposed at minor sides of the packaged semiconductor device;
a partial wire bond having one end connected to the tie bar and having a second end extending to a minor side of the packaged semiconductor device such that it is exposed by the mold compound.

17. The packaged semiconductor device of claim 16, wherein the tie bar is at least partially routed through the packaged semiconductor device.

18. The packaged semiconductor device of claim 16, wherein the partial wire bond is exposed by the mold compound at a same minor side as an end portion of the tie bar to which the partial wire bond is connected.

19. The packaged semiconductor device of claim 16, further comprising:
a second tab;
a second tie bar extending between opposite ends of the packaged semiconductor device and connected to the second tab, wherein the die is also attached to the second tab, and the mold compound at least partially surrounds the second tie bar such that end portions of the second tie bar are exposed at minor sides of the packaged semiconductor device; and a second partial wire bond having one end connected to the second tie bar and having a second end extending to a second minor side of the packaged semiconductor device such that the second partial wire bond is exposed by the mold compound.

20. The packaged semiconductor device of claim 19, wherein the tie bar routes a first power source signal and the second tie bar routes a second power source signal.

* * * * *